United States Patent
Kamaji et al.

(10) Patent No.: US 10,886,110 B2
(45) Date of Patent: Jan. 5, 2021

(54) PLASMA PROCESSING APPARATUS AND PREDICTION METHOD OF THE CONDITION OF PLASMA PROCESSING APPARATUS

(71) Applicant: HITACHI HIGH-TECH CORPORATION, Tokyo (JP)

(72) Inventors: Yoshito Kamaji, Tokyo (JP); Masahiro Sumiya, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 141 days.

(21) Appl. No.: 15/904,917

(22) Filed: Feb. 26, 2018

(65) Prior Publication Data

US 2019/0088455 A1    Mar. 21, 2019

(30) Foreign Application Priority Data

Sep. 20, 2017  (JP) .................. 2017-179668

(51) Int. Cl.
H01J 37/32 (2006.01)
H01J 37/24 (2006.01)
(Continued)

(52) U.S. Cl.
CPC ........ *H01J 37/32926* (2013.01); *G06F 17/18* (2013.01); *G06N 3/0481* (2013.01);
(Continued)

(58) Field of Classification Search
CPC ........ G06N 3/0481; G06N 20/10; G06N 7/00; H01J 37/32926; H01J 37/24;
(Continued)

(56) References Cited

U.S. PATENT DOCUMENTS

2002/0104832 A1  8/2002  Tanaka et al.
2003/0192864 A1  10/2003  Tanaka et al.
(Continued)

FOREIGN PATENT DOCUMENTS

CN  101595238 A  12/2009
JP  2002-100611 A  4/2002
(Continued)

OTHER PUBLICATIONS

Taiwanese Office Action dated Aug. 9, 2018 for Application No. 107103197.
(Continued)

*Primary Examiner* — Yuechuan Yu
(74) *Attorney, Agent, or Firm* — Miles & Stockbridge, P.C.

(57) ABSTRACT

A system that predicts an apparatus state of a plasma processing apparatus including a processing chamber in which a sample is processed is configured to have a data recording unit that records emission data of plasma during processing of the sample and electrical signal data obtained from the apparatus during the plasma processing, an arithmetic unit that includes a first calculation unit for calculating a first soundness index value of the plasma processing apparatus and a first threshold for an abnormality determination using a first algorithm with respect to the recorded emission data and a second calculation unit for calculating a second soundness index value of the plasma processing apparatus and a second threshold for the abnormality determination using a second algorithm with respect to the electrical signal data recorded in the data recording unit, and a determination unit that determines soundness of the plasma processing apparatus using the calculated first soundness index value and the first threshold and the cal-
(Continued)

culated second soundness index value and the second threshold.

4 Claims, 4 Drawing Sheets

(51) Int. Cl.
*G06F 17/18* (2006.01)
*G06N 7/00* (2006.01)
*G06N 20/10* (2019.01)
*G06N 3/04* (2006.01)
*H05H 13/00* (2006.01)

(52) U.S. Cl.
CPC ............... *G06N 7/00* (2013.01); *G06N 20/10* (2019.01); *H01J 37/24* (2013.01); *H01J 37/32* (2013.01); *H01J 37/32082* (2013.01); *H01J 37/3299* (2013.01); *H01J 37/32192* (2013.01); *H01J 37/32449* (2013.01); *H01J 37/32972* (2013.01); *H01J 2237/1825* (2013.01); *H01J 2237/334* (2013.01); *H01J 2237/335* (2013.01); *H05H 13/005* (2013.01)

(58) Field of Classification Search
CPC ........... H01J 37/32082; H01J 37/32449; H01J 37/3299; H01J 2237/335; H01J 2237/334; H01J 2237/1825; G06F 17/18; H05H 13/005

See application file for complete search history.

(56) References Cited

U.S. PATENT DOCUMENTS

| | | |
|---|---|---|
| 2004/0254761 A1 | 12/2004 | Sakano et al. |
| 2006/0155410 A1 | 7/2006 | Yamartino |
| 2008/0082653 A1 | 4/2008 | Huang et al. |
| 2010/0076729 A1 | 3/2010 | Davis et al. |
| 2011/0022215 A1 | 1/2011 | Keil et al. |

FOREIGN PATENT DOCUMENTS

| | | |
|---|---|---|
| JP | 2004-039952 A | 2/2004 |
| JP | 4570736 B2 | 10/2010 |
| KR | 2011-0073527 | 6/2011 |
| TW | 200832217 A | 8/2008 |

OTHER PUBLICATIONS

Office Action dated Dec. 17, 2018 for Korean Application No. 10-2017-0180656.

Park et al. "Study on the Extraction of Nuclear Power Plant Failure Patterns using AAKR", ISSN 1738-8333, pp. 40-47 (Jan. 2017).

PLASMA PROCESSING APPARATUS AND PREDICTION METHOD OF THE CONDITION OF PLASMA PROCESSING APPARATUS

INCORPORATION BY REFERENCE

The present application claims priority from Japanese application serial No. 2017-179668, filed on Sep. 20, 2017, the entire contents of which are hereby incorporated by reference into this application.

BACKGROUND OF THE INVENTION

Field of the Invention

The present invention relates to a plasma processing apparatus and a method of predicting a state of the plasma processing apparatus, and to the plasma processing apparatus and the plasma processing apparatus state prediction method for predicting the state of the plasma processing apparatus by performing arithmetic processing using sensor data output from the apparatus.

Background Art

In a semiconductor device manufacturing process, various manufacturing processes such as lithography, film formation, and etching are performed repeatedly. In a semiconductor device mass production factory, suppressing a decrease in an operation rate of a semiconductor manufacturing apparatus performing these manufacturing processes is one of important issues in mass production cost reduction. For example, in a plasma etching apparatus, a long term operation of the apparatus causes a temporal change inside a processing chamber due to accumulation of a reaction product and consumption of a part, deterioration of a component performing a plasma generation and control, and the like.

Thus, periodic maintenance for regular part replacement and apparatus cleaning and apparatus maintenance performed as a response to an unexpected apparatus failure/malfunction are performed. Both pieces of maintenance decrease the operation rate of the apparatus. Therefore, a cumulative time of the apparatus maintenance is required to be a necessary minimum from a viewpoint of mass production cost.

In order to reduce the cumulative time for the apparatus maintenance, it is effective to constantly monitor a state of each manufacturing apparatus, predict a time when the maintenance is required, and further specify an apparatus part to be maintained. With this, it is possible to perform the maintenance with high efficiency at an optimum time.

In the related art, in the plasma etching apparatus, as a method of monitoring an apparatus state, detecting/predicting an abnormality, for example, a method of monitoring the temporal change in the apparatus state from a model created by performing a principal component analysis of an apparatus signal data group acquired during an apparatus operation to predict an operation stop time is considered as disclosed in Japanese Patent No. 4570736. Further, a method of performing the principal component analysis of an emission data group obtained by a plasma emission spectroscopic measurement during the apparatus operation to predict a change in the apparatus state as disclosed in JP-A-2002-100611 and JP-A-2004-39952.

SUMMARY OF THE INVENTION

However, required performance for mass production stability in the plasma processing apparatus becomes increasingly severe due to recent miniaturization of a semiconductor device, a complicated structure, and a change in a material. Therefore, a change amount in the apparatus state when transitioning from a normal apparatus state to an abnormal apparatus state becomes increasingly a narrow amount, and a more accurate abnormality determination model is required in order to perform abnormality detection with high accuracy.

An apparatus configuration and a plasma etching processing condition become increasingly diversified due to a multi-type device production which is increased in recent years. With this, it becomes more difficult to create an abnormality determination model with high versatility that allows various apparatus configurations and processing conditions as compared with related arts.

In such circumstance, as the techniques disclosed in Japanese Patent No. 4570736, JP-A-2002-100611, and JP-A-2004-39952, in the abnormality detection methods relying on one abnormality determination algorithm such as the principal component analysis, detection accuracy decreases, and as a result, there is a possibility of increasing false information. Additionally, it is difficult to determine whether a suddenly detected abnormality indicates a change in the apparatus state requiring the maintenance or is the false information caused by noise or other disturbance. In the related arts disclosed in Japanese Patent No. 4570736, JP-A-2002-100611, and JP-A-2004-39952, there is no sufficient consideration for a method of reducing the increase of false information and an interpretation on a determination result.

In order to reduce the false information, first, it is necessary to originally develop or select an appropriate (representing an actual phenomenon well) determination algorithm with respect to a feature of signal data used for creating of the abnormality determination model and a trajectory of the temporal change (for example, sudden or linear/non-linear change). When an algorithm to be used is inappropriate, the detection accuracy decreases.

As another method of reducing the false information, it can be considered to use a plurality of determination algorithms. Even in the case, unless mutual appropriateness in the determination algorithms to be used is taken into consideration, the detection accuracy decreases.

The present invention is made to solve the problems described above, and a purpose of the present invention is to provide a plasma processing apparatus and a plasma processing apparatus state prediction method capable of detecting an abnormality of an apparatus state with high accuracy, specifying an abnormality factor, and predicting a time when maintenance is required in the plasma processing apparatus having a processing chamber that processes a sample by using a plurality of abnormality determination algorithms in which appropriateness of algorithms is considered.

According to an aspect of the present invention, there is provided a plasma processing apparatus in which a state is predicted by an analysis apparatus and includes a processing chamber in which a sample is subjected to plasma processing. The analysis apparatus predicts the state of the plasma processing apparatus based on a first soundness index value obtained by analyzing a first data obtained from the plasma processing apparatus using a first algorithm and a second soundness index value obtained by analyzing a second data obtained from the plasma processing apparatus using a second algorithm, and the second algorithm is an algorithm in which a second time of the plasma processing in which the state is determined as abnormal by the second soundness index value is a time within a range of a time obtained by subtracting a predetermined time from a first time of the plasma processing in which the state is determined as abnormal by the first soundness index value to a time obtained by adding the predetermined time to the first time.

According to an aspect of the present invention, there is provided a plasma processing apparatus state prediction method that predicts a state of a plasma processing apparatus including a processing chamber in which a sample is subjected to plasma processing. The state of the plasma processing apparatus is predicted based on a first soundness index value obtained by analyzing a first data obtained from the plasma processing apparatus using a first algorithm and a second soundness index value obtained by analyzing a second data obtained from the plasma processing apparatus using a second algorithm. The second algorithm is an algorithm in which a second time of the plasma processing in which the state is determined as abnormal by the second soundness index value is a time within a range of a time obtained by subtracting a predetermined time from a first time of the plasma processing in which the state is determined as abnormal by the first soundness index value to a time obtained by adding the predetermined time to the first time.

According to the present invention, it is possible to predict an apparatus state and optimally perform plasma processing and apparatus maintenance by a plasma processing apparatus and a plasma processing apparatus state prediction method for constantly recording apparatus signal data output from the apparatus, detecting an abnormality of the apparatus state with high accuracy, specifying an abnormality factor, and further predicting a time when the maintenance is required.

DETAILED DESCRIPTION OF THE INVENTION

Figure 1:
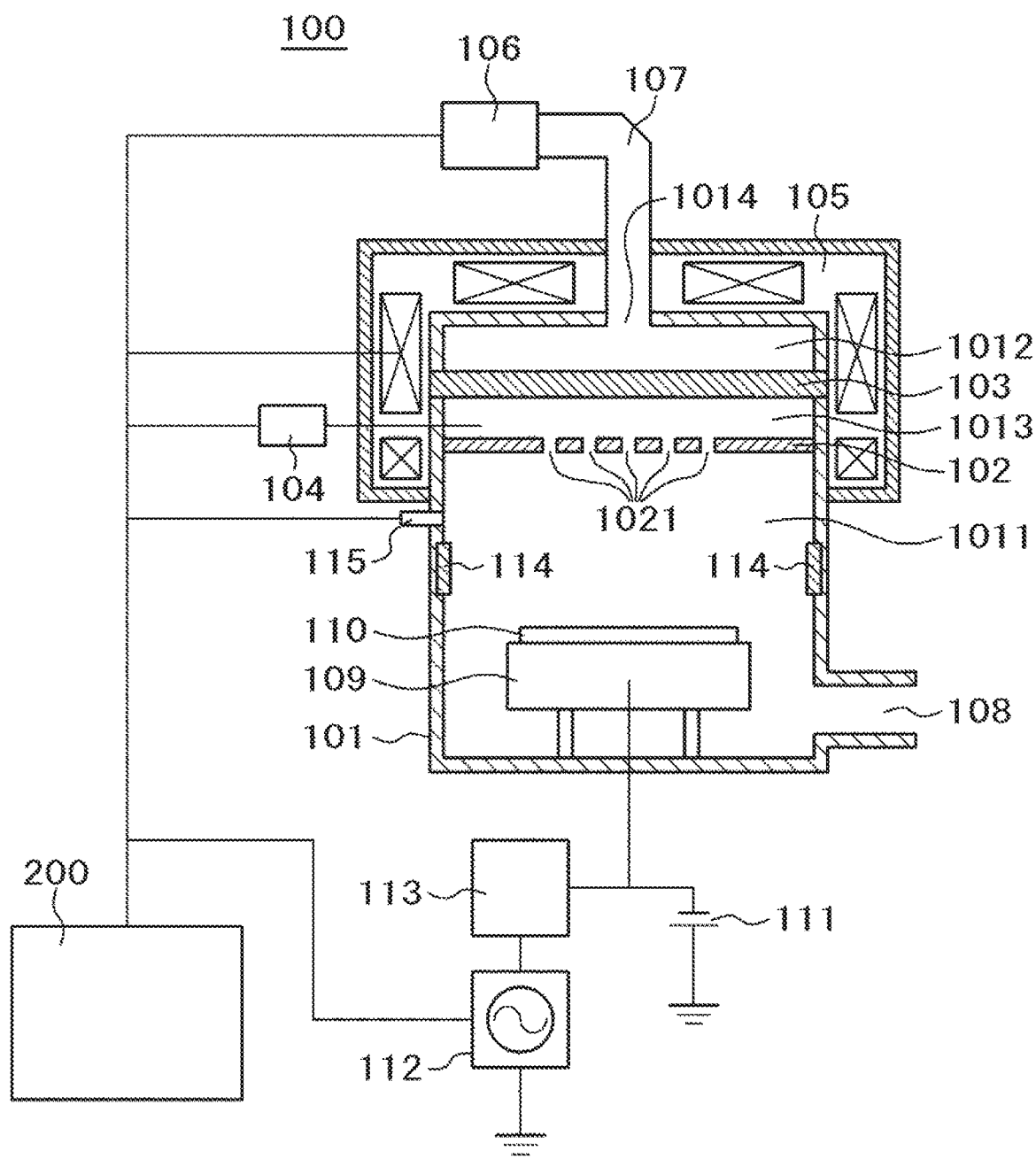
FIG. 1 is a longitudinal section diagram illustrating a schematic configuration of a plasma processing apparatus according to an embodiment of the present invention.

The present invention relates to a plasma processing apparatus having a processing chamber that processes a sample and to a method of predicting a state of the plasma processing apparatus. The present invention relates to the plasma processing apparatus that predicts the state of the apparatus by an index value indicating soundness of a plasma processing apparatus state calculated by applying an algorithm in which appropriateness is considered (hereinafter, soundness index value) and a boundary for determining whether the soundness index value indicates an abnormality of the apparatus state or indicates normality (hereinafter, threshold) with respect to an apparatus signal data acquired from the plasma processing apparatus, and to the method of predicting the state of the plasma processing apparatus.

A system configuration of the plasma processing apparatus according to the present invention is configured to have a data recording unit that records emission data obtained by a spectroscopic measurement during plasma processing in the plasma processing apparatus and electrical signal data (hereinafter, refer to as electrical signal data) other than the emission data obtained from the plasma processing apparatus, a directory unit that stores various types of analysis algorithms, an arithmetic unit that calculates a soundness index value 1 and a threshold 1 of the apparatus using a first algorithm selected from the directory unit with respect to the emission data recorded by the data recording unit and calculates a soundness index value 2 and a threshold 2 of the apparatus using a second algorithm selected from the directory unit with respect to the electrical signal data, and a determination unit that automatically determines that the soundness of the apparatus state is impaired when the soundness index value 1 and the soundness index value 2 exceeds the threshold 1 and the threshold 2 respectively.

In the present invention, in the system configuration of the plasma processing apparatus described above, it is configured to have the data recording unit that stores apparatus signal data for learning recorded from the apparatus in a process of changing from a normal apparatus state to an abnormal apparatus state in advance.

In the present invention, in the system configuration of the plasma processing apparatus described above, it is configured to have means for selecting an algorithm 2 in which a result of calculating a time 1 in which the soundness index value 1 continuously exceeds the threshold 1 by calculating the soundness index value 1 of the apparatus and the threshold 1 for determining that the apparatus is abnormal using an algorithm 1 with respect to the emission data, and a time 2 in which the soundness index value 2 of the apparatus exceeds the threshold 2 for determining that the apparatus is abnormal with respect to the data other than the emission is 0.5<time 1/time 2<1.5 using the apparatus signal data for learning stored in the data recording unit.

In the present invention, in the system configuration of the plasma processing apparatus described above, the determination unit is configured to automatically determine that the soundness of the apparatus state is impaired when the soundness index value 1 and the soundness index value 2 continuously exceed the threshold 1 and the threshold 2 respectively.

In the present invention, in the system configuration of the plasma processing apparatus described above, it is configured to have a display unit that displays the temporal change in the relationship between the soundness index value and the threshold.

In the present invention, in the system configuration of the plasma processing apparatus described above, it is configured to have a control unit that controls the plasma processing apparatus based on a result determined by the determination unit.

In the present invention, in the system configuration of the plasma processing apparatus described above, an apparatus control unit is configured to have means for processing a sample referred to as a dummy other than a normal processing wafer in accordance with a preset processing sequence in a case where the abnormality is detected by the determination unit.

In the present invention, in the system configuration of the plasma processing apparatus described above, the apparatus control unit is achieved by having means for plasma cleaning the inside of an apparatus processing chamber in the case where the abnormality is detected by the determination unit.

In the present invention, in the system configuration of the plasma processing apparatus described above, the apparatus control unit is configured to display a warning on the display unit in the case where the abnormality is detected by the determination unit.

In the present invention, in the system configuration of the plasma processing apparatus described above, it is configured to record an electrical state in an arbitrary point of the plasma processing apparatus as the electrical signal data to be recorded by the data recording unit.

In the present invention, in the system configuration of the plasma processing apparatus described above, it is configured to have means for performing wavelength decomposition on the emission data recorded by the data recording unit.

In the present invention, in the system configuration of the plasma processing apparatus described above, it is configured to have means for performing frequency decomposition on the electrical data recorded by the data recording unit.

In the present invention, in the system configuration of the plasma processing apparatus described above, it is configured so as to convert the emission data and the signal data recorded by the data recording unit into a statistical amount.

In the present invention, in the system configuration of the plasma processing apparatus described above, it is configured so as to have a mechanism for calculating a correlation of each data type of the recorded emission data and electrical signal data, and to use data types having the low correlation fora calculation of the soundness index value.

In the present invention, in the system configuration of the plasma processing apparatus described above, it is configured to have means for segmenting emission data and electrical signal data recorded during multi-stage step plasma processing which is performed repeatedly for each wafer processing and in which a control value is different in each wafer processing for each step, and connecting the segmented data in parallel.

In the present invention, in the system configuration of the plasma processing apparatus described above, it is configured to have means for comparing time-series waveforms of the data for each repetition with respect to the emission data and the electrical signal data recorded during the multi-stage step plasma processing which is performed repeatedly for each wafer processing and in which the control value is different in each wafer processing, and extracting only a part in which the signal waveform is changed for a long term.

In the present invention, in the system configuration of the plasma processing apparatus described above, it is configured to have means for removing a radio frequency component of the signal data.

In the present invention, in the system configuration of the plasma processing apparatus described above, it is configured such that the arithmetic unit includes a mechanism for calculating a contribution rate of each data type with respect to the calculated soundness index value and specifying a data type contributing a change in the soundness index value, and recalculates the soundness index value using only the data type having high contribution rate.

In the present invention, in the system configuration of the plasma processing apparatus described above, it is configured such that the arithmetic unit includes the mechanism for calculating the contribution rate of each data type with respect to the calculated soundness index value, and clarifies a change factor of the soundness index value by specifying the data type contributing the change in the soundness index value and displaying the specified data type on the display unit.

In the present invention, in the system configuration of the plasma processing apparatus described above, it is configured such that the arithmetic unit includes a mechanism for calculating a time that exceeds a threshold by applying a linear or non-linear regression equation to the calculated soundness index value, and includes means for predicting before an actual abnormality detection time in the determination unit.

The same reference numeral is assigned to those having the same function in all the drawings for describing the embodiment, and the repetitive description will be omitted in principle. Hereinafter, the embodiment of the present invention will be described with reference to drawings.

However, the present invention is not construed as being limited to the description of the embodiment described below. Those who skilled in the art can easily understand that a specific configuration can be changed without departing from the spirit or gist of the present invention.

The plasma processing apparatus and the method of predicting the state of the plasma processing apparatus according to the embodiment of the present invention will be described with reference to FIGS. 1 to 4. An example of the plasma processing apparatus in which the state prediction method of the plasma processing apparatus according to the present invention is employed will be described with reference to FIG. 1.

FIG. 1 is a longitudinal section diagram for illustrating a configuration of a microwave electron cyclotron resonance (ECR) plasma etching apparatus 100 (hereinafter, referred to as plasma processing apparatus 100) which is the example of the plasma processing apparatus according to the embodiment.

FIG. 1 schematically shows a substrate electrode 109 installed inside a processing chamber 101 configured by a vacuum container, supply apparatuses of an electric field and amagnetic field installed outside of the processing chamber 101, and power supplies. A device and an apparatus other than those described above can be disposed or removed according to a required performance or specification so as not to significantly impair an operation and an effect of the invention according to the embodiment by a person having ordinary knowledge in a technical field according to the embodiment.

In a plasma processing apparatus 100 shown in FIG. 1, a disk-shaped shower plate 102 formed of a conductor having a plurality of opening parts 1021 for introducing a reactive gas and a dielectric window 103 (for example, made of quartz) are disposed in the upper part of the processing chamber 101 having a cylindrical shape. An inside 1011 of the processing chamber 101 is sealed hermetically by the dielectric window 103.

The inside 1011 of the processing chamber 101 is supplied with the reactive gas used for etching processing. A flow rate of the reactive gas is controlled by a gas supply apparatus 104, and the reactive gas is supplied to the inside 1011 of the processing chamber 101 through the shower plate 102 formed of the conductor and in which the plurality of the opening parts 1021 are formed.

An opening part 1014 in the upper part of the processing chamber 101 is disposed with a magnetron 106 generating an electromagnetic wave and a waveguide 107 (or antenna) that transmits the electromagnetic wave generated by the magnetron 106 to a cylindrical inner region 1012 of the processing chamber 101. An end part of the waveguide 107 is connected to the opening part 1014.

A cavity resonator for a microwave introduced from the waveguide 107 is formed by a space in the cylindrical inner region 1012 partitioned by the dielectric window 103 and a space formed in a region 1013 between the shower plate 102 and the dielectric window 103 in the upper part of the inside of the processing chamber 101.

Solenoid coils 105 that form the magnetic field inside the cavity resonator formed by the cylindrical region 1012 and the region 1013 inside the processing chamber 101 are disposed in the outer circumference and the upper part of the processing chamber 101. It can be controlled such that a magnetic field satisfying a condition for generating the electron cyclotron resonance (ECR) for the microwave introduced from the waveguide 107 is formed inside the cavity resonator formed by the cylindrical region 1012 and the region 1013 inside theprocessing chamber 101 by adjusting a current flowing through the solenoid coil 105.

The electromagnetic wave used in the embodiment is a microwave of 2.45 GHz oscillated from the magnetron 106, but this is not limited particularly by the effect and the operation.

The microwave oscillated by the magnetron 106 propagates inside the waveguide 107 and is introduced to the cavity resonator formed by the cylindrical region 1012 and the region 1013 inside the processing chamber 101, and is propagated from the plurality of the opening parts 1021 formed in the shower plate 102 to a space of the inside 1011 of the processing chamber 101.

A spectroscopic detector 115 for detecting an emission state of plasma generated in the inside 1011 is attached to the processing chamber 101. A signal obtained by detecting the emission of the plasma generated in the inside 1011 of the processing chamber 101 by the spectroscopic detector 115 is transmitted to a processing control system configuration 200 of the plasma processing apparatus.

A vacuum evacuation pump (not shown) is connected to the lower part of the processing chamber 101 through a vacuum evacuation pipe 108 so that the inside 1011 of the processing chamber 101 can be evacuated. The substrate electrode (sample stage) 109 installed in the lower part of the processing chamber 101 so as to face the shower plate 102 in the upper part of the processing chamber 101 has a surface covered with a dielectric film (not shown).

A sample (product wafer) 110 is transported from the outside of the processing chamber 101 to the inside 1011 of the processing chamber 101 by a transportation apparatus such as a robot arm (not shown) in a state where the inside 1011 of the processing chamber 101 is in the atmospheric pressure. Then, the sample is mounted on the substrate electrode 109 and is attracted electrostatically to the substrate electrode 109 by a DC voltage applied to an electrode (not shown) inside the substrate electrode 109 from a DC power supply 111.

A radio frequency power supply 112 can apply radio frequency power to the substrate electrode 109 through a radio frequency matching device 113. An earth electrode 114 connected to the ground is installed in the middle of an inner wall surface of the processing chamber 101, and a radio frequency current applied on the substrate electrode 109 by the radio frequency power supply 112 flows to the earth electrode 114 through the plasma generated in the inside 1011 of the processing chamber 101.

The etching processing in the plasma processing apparatus 100 described above is started in the following flow.

First, in the state where the sample (product wafer) 110 is mounted on the substrate electrode 109 and attracted electrostatically, a process gas is introduced from the gas supply apparatus 104 into the inside 1011 of the processing chamber 101 to control the inside 1011 of the processing chamber 101 to a desired pressure while evacuating the inside 1011 of the processing chamber 101 with the vacuum evacuation pump (not shown) through the vacuum evacuation pipe 108.

Next, in a state where the inside 1011 is controlled to the desired pressure, a magnetic field satisfying an ECR condition for the microwave introduced from the waveguide 107 is formed inside the cavity resonator formed by the cylindrical region 1012 and the region 1013 inside the processing chamber 101 by adjusting the current flowing through the solenoid coil 105.

Next, the electromagnetic wave (microwave) oscillated by the magnetron 106 is supplied to the inside of the cavity resonator formed by the cylindrical region 1012 and the region 1013 inside the processing chamber 101 through the waveguide 107. The electromagnetic wave is supplied to the inside of the cavity resonator formed with the magnetic field satisfying the condition for generating the electron cyclotron resonance (ECR) in order to generate the electron cyclotron resonance.

A part of the electromagnetic wave which is electron-cyclotron-resonated inside the cavity resonator formed by the region 1012 and the region 1013 is propagated from the plurality of the opening parts 1021 formed in the shower plate 102 to the inside 1011 of the processing chamber 101. In the inside 1011 of the processing chamber 101 in which the electromagnetic wave is propagated, a gas for processing supplied from the gas supply apparatus 104 is excited, and the plasma is generated inside 1011 of the processing chamber 101.

In the state, when the radio frequency power is applied from the radio frequency power supply 112 connected to the substrate electrode 109, an ion is drawn from the plasma generated in the inside 1011 of the processing chamber 101 to the upper surface of a wafer 110 mounted on the substrate electrode 109, thereby performing the etching processing on the surface of the wafer 110.

Figure 2:
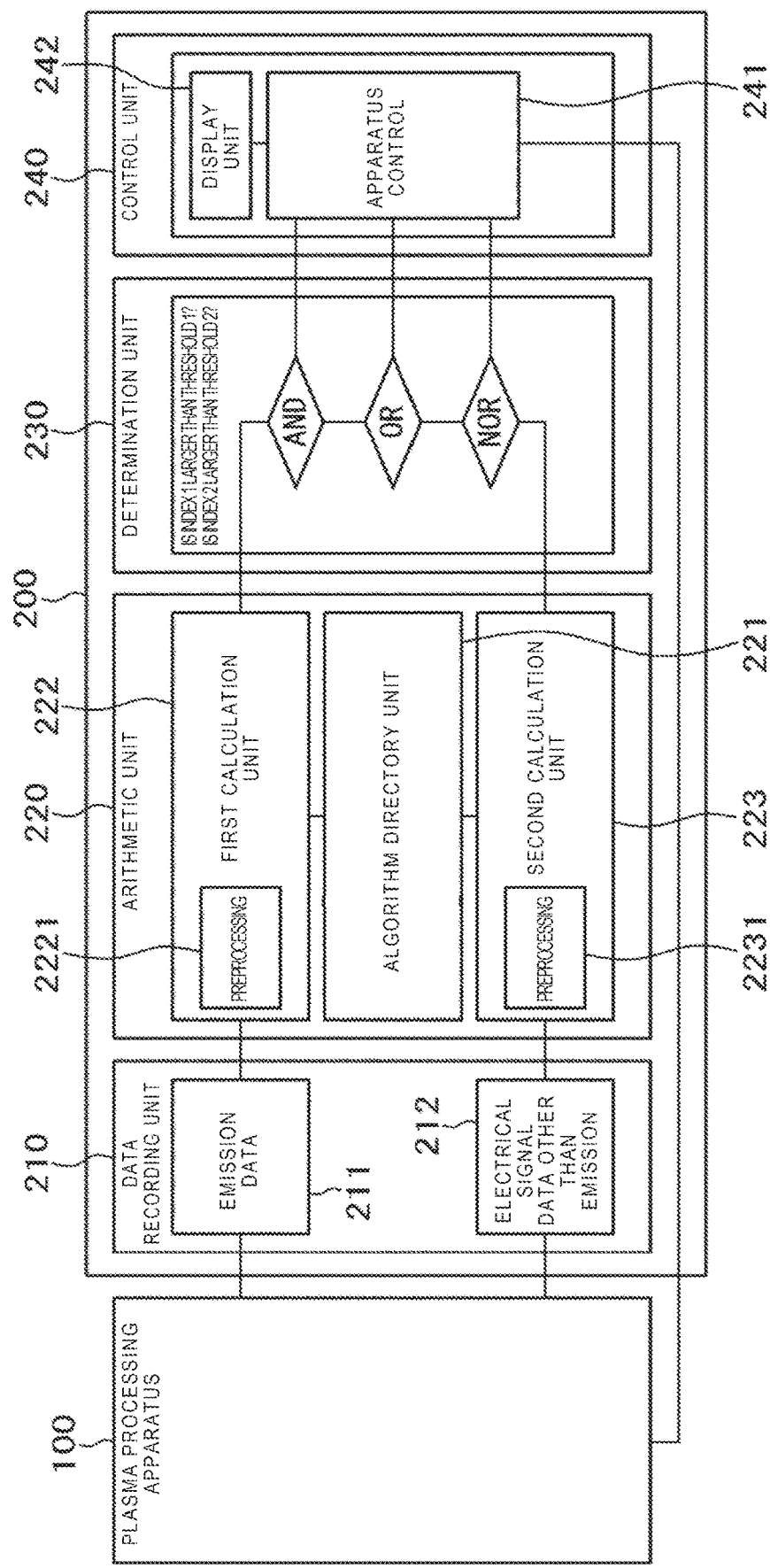
FIG. 2 is a block diagram showing a system configuration of the plasma processing apparatus according to the embodiment of the present invention.

FIG. 2 illustrates the processing control system configuration 200 of the plasma processing apparatus according to the embodiment.

The processing control system configuration 200 of the plasma processing apparatus according to the embodiment includes a data recording unit 210, an arithmetic unit 220, a determination unit 230, and a control unit 240.

The data recording unit 210 includes an emission data recording unit 211 and an electrical signal data recording unit 212. The emission data recording unit 211 records data obtained by the spectroscopic measurement during a plasma generation in the spectroscopic detector 115 attached to the processing chamber 101 plasma of the processing apparatus 100. The electrical signal data recording unit 212 records the electrical signal data (electrical signal data obtained from gas supply apparatus 104, solenoid coil 105, magnetron 106, and radio frequency power supply 112 in the configuration shown in FIG. 1) obtained from the plasma processing apparatus 100.

The arithmetic unit 220 includes an algorithm directory unit 221 storing various types of analysis algorithms, a first calculation unit 222, and a second calculation unit 223.

The first calculation unit 222 includes a first preprocessing unit 2221 for performing the preprocessing on the emission data recorded in the emission data recording unit 211. The first calculation unit 222 calculates the soundness index value 1 of the plasma processing apparatus 100 and the threshold 1 for determining that the apparatus is abnormal using the first algorithm selected from the algorithm directory unit 221 with respect to emission data subjected to the preprocessing in the first preprocessing unit 2221.

The second calculation unit 223 includes a second preprocessing unit 2231 for performing the preprocessing on the electrical signal data recorded in the electrical signal data recording unit 212. The second calculation unit 223 calculates the soundness index value 2 of the plasma processing apparatus 100 and the threshold 2 for determining that the apparatus is abnormal using the second algorithm selected from the algorithm directory unit 221 with respect to electrical signal data subjected to the preprocessing in the second preprocessing unit 2231.

The determination unit 230 compares the soundness index values 1 and 2 calculated in the arithmetic unit 220 with the thresholds 1 and 2, respectively. As a result, when the soundness index value 1 exceeds the threshold 1 and the soundness index value 2 exceeds the threshold 2, it is determined that the soundness of the state of the plasma processing apparatus 100 is impaired.

The control unit 240 includes an apparatus control unit 241 and a display unit 242. The apparatus control unit 241 performs a predetermined control on the plasma processing apparatus 100 based on a determination result of the determination unit 230. The display unit 242 displays a warning in a case where it is determined that the soundness of the state of the plasma processing apparatus 100 is impaired in the determination unit 230.

In the case where the abnormality is detected by the determination unit 230, there are the following methods as the predetermined control on the plasma processing apparatus 100 executed by the apparatus control unit 241 of the control unit 240.

As a control method, in a state where a sample referred to as a dummy other than a normal sample (product wafer) is mounted on the substrate electrode 109, cleaning (plasma cleaning) is performed to remove a reaction product deposited on the inner wall surface of the processing chamber 101 and the surface of the substrate electrode 109 when the sample is processed in accordance with a preset processing sequence. As another control method, in a state where a sample is not mounted on the substrate electrode 109, the cleaning (plasma cleaning) is performed to remove a reaction product deposited on the inner wall surface of the processing chamber 101 and the surface of the substrate electrode 109 when the sample is processed by generating the plasma in the inside 1011 of the processing chamber 101 of the plasma processing apparatus 100.

In a case where the apparatus state is determined to be abnormal even when such apparatus controls are repeated a plurality of times, it can be determined that maintenance accompanying an apparatus stop is necessary.

Further, in addition to the configuration described above, it is possible to constantly recognize a temporal change in the apparatus state by displaying the temporal change in relationship between the soundness index values 1 and 2 and the thresholds 1 and 2, and displaying the warning when it is determined as abnormal by the determination unit 230 on the display unit 242.

Various types of analysis algorithms to be stored in the algorithm directory unit 221 of the arithmetic unit 220 store, for example, various generally known machine learning algorithms such as those included in Machine learning by Kevin P. Murphy. The soundness index value 1 and the threshold 1 are calculated using the first algorithm, and the soundness index value 2 and the threshold 2 are calculated using the second algorithm using two types of algorithms selected from the various machine learning algorithms.

In the embodiment, a case where principal component analysis (PCA) which is a type of multivariable analysis is selected as the first algorithm used for analyzing the data recorded in the emission data recording unit 211 and auto associative kernel regression (AAKR) is selected as the second algorithm used for analyzing the data recorded in the electrical signal data recording unit 212 will be described.

Figure 3A:
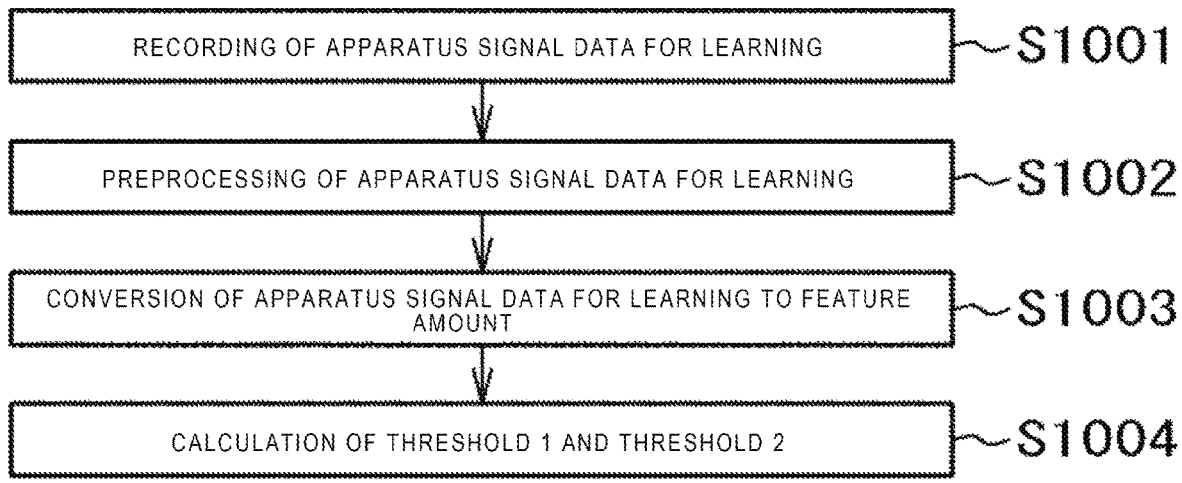
FIG. 3A is a flow diagram showing a procedure for calculating a threshold using apparatus signal data for learning in the system configuration of the plasma processing apparatus according to the embodiment of the present invention.

FIG. 3A shows a procedure of calculating the threshold 1 using the first algorithm with respect to the apparatus signal data obtained from the plasma processing apparatus 100 as a reference in which a normal state is confirmed, and calculating the threshold 2 using the second algorithm with respect to the data recorded in the electrical signal data recording unit 212 as a pre-stage for determining the state of the plasma processing apparatus 100 to be an evaluation target.

Hereinafter, the contents of each step will be described in detail.

First, the data recording unit 210 records apparatus signal data for an arbitrary time from the plasma processing apparatus 100 which is the reference or the normal state (S1001). In the embodiment, such apparatus signal data recorded for the arbitrary time from the plasma processing apparatus 100 which is the reference or the normal state is referred to as apparatus signal data for learning.

It is desirable to record the apparatus signal data for learning during a cumulative processing time when there is no change in the state of the plasma processing apparatus 100 recorded in the emission data recording unit 211 and the electrical signal data recording unit 212 of the data recording unit 210 or the change is small.

There is a case where the deterioration of the state of the plasma processing apparatus 100 recorded by the data recording unit 210 appears as a steep change due to the transient of the control. Accordingly, it is desirable to set a sampling frequency of the data recording unit 210 at the time of recording the apparatus signal data for learning to 5 Hz or more from a viewpoint of abnormality detection accuracy improvement.

Here, the apparatus signal data recorded by the data recording unit 210 is classified into the following two types. That is, a first type is data recorded by the electrical signal data recording unit 212, and is electrical signal data indicating an electrical state at an arbitrary point of the plasma processing apparatus 100 including each component configuring the plasma processing apparatus 100. A second type is data recorded by the emission data recording unit 211, and is data relating to plasma emission obtained by the spectroscopic measurement of the plasma emission by the spectroscopic detector 115 during the plasma processing.

Next, in the first preprocessing unit 2221 and the second preprocessing unit 2231 of the arithmetic unit 220, the preprocessing of the apparatus signal data recorded by the data recording unit 210 is performed (S1002). The preprocessing includes the following work, and each work can be performed as necessary.

That is, in a case where it can be determined that the electrical signal data recorded by the electrical signal data recording unit 212 of the apparatus signal data recorded by the data recording unit 210 has a lot of radio frequency noise, a radio frequency component is removed from the apparatus signal data recorded by the electrical signal data recording unit 212. The preprocessing is executed by the second preprocessing unit 2231 included in the second calculation unit 223.

On the other hand, wavelength decomposition is performed for the emission data recorded by the emission data recording unit 211 of the apparatus signal data recorded by the data recording unit 210, and emission intensity data of each wavelength is acquired. The preprocessing is executed by the first preprocessing unit 2221 included in the first calculation unit 222.

There is a case where a recording time for each data type is deviated in the apparatus signal data recorded by the data recording unit 210. Accordingly, it is desirable to correct the deviation of the recording time for each data type. The correction of the deviation of the recording time for each data type is performed by the first preprocessing unit 2221 and the second preprocessing unit 2231. As a method of correcting the time deviation, for example, dynamic time warping or the like can be used.

In a case where the number of each of data types (variables) of the apparatus signal data is large, a calculation load may be reduced by decreasing the number of data types by extracting data types having a low correlation as the temporal change with respect to each data type, and using the extracted data types having the low correlation for the calculation of the soundness index value. As means for calculating the correlation of each data type of the recorded the emission data and the electrical signal data, for example, Fisher Criterion can be used.

In the plasma processing of the sample and the plasma cleaning processed during the processing, in some cases, a multi-stage step is used in which a control value for controlling the plasma processing apparatus 100 is changed for each step by the apparatus control unit 241. In the case, the data may be segmented for each step and the segmented data may be connected in parallel.

Next, the apparatus signal data subjected to the preprocessing in the first preprocessing unit 2221 and the second preprocessing unit 2231 is converted to a feature amount (S1003). As the feature amount, a frequency component or the like calculated by a statistical amount (mean, standard deviation, variance, skewness, central value, average deviation, kurtosis, median, peak to peak, crest factor, and peak-to-average power ratio), fast Fourier transform (FFT), time-frequency analysis (TFA), or the like can be mentioned.

In a case where a part is known in advance in which a change which can clearly distinguish between the normal state and the abnormal state of the apparatus occurs in a specific region of a time-series waveform, it is possible to expect the abnormality detection with high accuracy by extracting a change amount of the part.

A plurality of feature amounts are selected and converted as necessary. It is possible to compare change amount of a numerical value regardless of an absolute value of the data type by standardizing the converted value for each feature amount of the data type.

Next, the threshold 1 for determining the soundness of the apparatus state is calculated using the emission data, and the threshold 2 for determining the soundness of the apparatus state is calculated using the electrical signal data among the apparatus signal data for learning which is converted to the feature amount in S1003 (S1004).

In the embodiment, a case where the principal component analysis (PCA) is used for calculating the threshold 1 and the auto associative kernel regression (AAKR) is used for calculating the threshold 2 will be described.

In general, the principal component analysis (PCA) is an unsupervised algorithm that can reduce a dimension of data while maintaining information in a direction with a large variance for the data. The direction with the large variance is referred to as a principal component (PCs), and it is possible to represent data existing in a high dimensional space in a low dimensional space without avoiding loss of the information by reconstructing the data based on the principal component.

As shown in an equation (formula 1), the PCA decomposes matrix data X as a sum of PC scores $t_i$ and PC loadings $p_i$ plus a residual matrix E.

$$X = t_1 p_1^T + t_2 p_2^T + t_k p_k^T + E = \sum_{i=1}^{k} t_i p_i^T + E = \hat{X} + E \quad \text{(Formula 1)}$$

Here, X is a matrix storing the direction having the larger variance.

Mathematically, the PCA executes an eigenvector decomposition of a variance/covariance matrix (X) shown in an equation (formula 2).

$$\text{cov}(X) = \begin{pmatrix} \text{cov}(x_1, x_1) & \cdots & \text{cov}(x_1, x_k) \\ \vdots & \ddots & \vdots \\ \text{cov}(x_k, x_1) & \cdots & \text{cov}(x_k, x_k) \end{pmatrix} \quad \text{(Formula 2)}$$

Here, $$X \in \mathfrak{R}^{m \times n} \quad \text{(Formula 3)}$$

m is the number of samples stored as a row vector and n is a process variable (n<<m) stored as a column vector. The cov (X) is the variance/covariance matrix of k rows and k columns. In a case where each variable is normalized as an average value of zero and standard deviation of one, cov (X) means a correlation matrix.

In algebra, the eigenvector of a square matrix means a vector in which a direction is maintained in a linear transformation as shown in an equation (formula 4).

$$\text{cov}(X) p_i = \lambda_i p_i \quad \text{(Formula 4)}$$

Here, $\lambda_i$ is a scalar value based on the eigenvector $P_i$ known as eigenvalue.

The matrix data X is expressed by $t_i$ and $p_i$ as shown in an equation (formula 5).

$$X p_i = t_1 \quad \text{(Formula 5)}$$

The principal component in the emission data of apparatus signal data for learning subjected to the first to the third steps by the PCA is obtained, and then a threshold 1 for determining whether the apparatus state is abnormal is calculated from a soundness index value 1 for the soundness index value 1 calculated using apparatus signal data (hereinafter, apparatus signal data for evaluation) recorded newly from an apparatus (apparatus for evaluation) which is required to evaluate the soundness.

A case where T-squared statistics (PCA-T-squared) is employed for the calculation of the threshold 1 in the embodiment will be described. The threshold 1 is defined as a region boundary of a rejection region 1% excluding a confidence interval 99%, and it is defined such that the apparatus state at the time of acquisition of apparatus signal data for evaluation corresponding to the rejection region is determined to be abnormal.

An equation (formula 6) is used to calculate the threshold 1.

$$T_\alpha^2 = \frac{r(m-1)}{m-r} F_{r,m-r,\alpha} \qquad \text{(Formula 6)}$$

Here, $T_\alpha^2$ indicates a threshold having the confidence interval 99%, m is the number of samples of X, r is the number of stored principal component PCs, $F_{r,m-r,\alpha}$ indicates a rejection region $\alpha\%$ of F distribution having r and (m−r) degrees of freedom.

The AAKR is a non-parametric technique for finding a non-linear relationship between an input vector and an output vector. The electrical signal data (X) of apparatus signal data for learning subjected to the first to the third steps by a kernel function (weight function) and a measurement value $X_{abs}$ of electrical signal data in the apparatus signal data for evaluation are reconstructed.

Here, the electrical signal data (X) of the apparatus signal data for learning subjected to the first to the third steps configured of time i and m×1 of n samples is defined as a memory matrix D and expressed by an equation (formula 7).

$$D = [X_1 \; X_2 \; \ldots \; X_m]^T = \begin{bmatrix} x_1(1) & x_1(2) & \ldots & x_1(m) \\ x_2(1) & x_2(2) & \ldots & x_2(m) \\ \vdots & \vdots & \ddots & \vdots \\ x_n(1) & x_n(2) & \ldots & x_n(m) \end{bmatrix} \qquad \text{(Formula 7)}$$

The memory matrix D functions as history data X representing the reference for calculating the threshold 2 and the soundness index value 2 or the normal apparatus state.

As described above, the calculated threshold 1 is stored in the first calculation unit 222, and the threshold 2 is stored in the second calculation unit.

Next, a procedure for determining the state of the plasma processing apparatus 100 to be an evaluation target using the threshold 1 and the threshold 2 calculated according to the procedure of FIG. 3A will be described with reference to FIG. 3B.

First, processing steps of recording the apparatus signal data for evaluation from the plasma processing apparatus 100 to be the evaluation target (S2001), performing the preprocessing on the recorded apparatus signal data for evaluation (S2002), and converting the preprocessed apparatus signal data for evaluation into the feature amount (S2003) are the same as the processing from S1001 to S1003 in the processing of the apparatus signal data for learning described in FIG. 3A.

Here, there is the case where the deterioration of the state of the plasma processing apparatus 100 to be the evaluation target which is recorded by the data recording unit 210 appears as the steep change due to the transient of the control. Accordingly, it is desirable to set the sampling frequency of the data recording unit 210 at the time of recording the apparatus signal data for learning to 5 Hz or more from the viewpoint of abnormality detection accuracy improvement.

Next, in S2004, a soundness index value 1 is calculated using the emission data of the apparatus signal data for evaluation, and a soundness index value 2 is calculated using the electrical signal data. Here, in steps from S2001 to S2004, the soundness index value 1 is calculated using the first algorithm for the apparatus signal data obtained from the plasma processing apparatus 100 to be an evaluation target, and the soundness index value 2 is calculated using the second algorithm for the data recorded in the electrical signal data recording unit 212.

In the case of using PCA-T-squared in the embodiment, the emission data in the apparatus signal data for evaluation subjected to the steps from S2001 to S2003 which are the same as the steps from S1001 to S1003 in the processing of the apparatus signal data for learning is reconstructed using a PC space constructed by the emission data of the apparatus signal data for learning in S1004 shown in FIG. 3A, and the soundness index value 1 can be calculated by an equation (formula 8).

$$T^2 = t \Sigma^{-1} t^T \qquad \text{(Formula 8)}$$

Here, t is data having k columns projected on the PC space, and $\Sigma^{-1}$ is an inverse square matrix of eigenvalues $\lambda_i$ up to the rth in descending order of the correlation matrix.

An input value of AAKR in the embodiment is a measurement value $X_{obs}$ of the electrical signal data in the apparatus signal data for evaluation subjected to the steps from S2001 to S2003 which are the same as the steps from S1001 to S1003 in the processing of the apparatus signal data for learning, and an output value is a prediction value $X_{est}$ thereof.

First, an Euclidean distance d between the electrical signal data X in the apparatus signal data for learning subjected to the steps from S1001 to S1003 and the measurement value $X_{obs}$ of the electrical signal data in the apparatus signal data for evaluation subjected to the steps from S2001 to S2003 which are the same as the apparatus signal data for learning is calculated according to an equation (formula 9).

$$d = [d_1 d_2 \ldots d_m]^T \qquad \text{(Formula 9)}$$

Then, the Euclidean distance d is converted to weight W defined by the kernel function. Various generally known kernel functions can be used for the kernel function for calculating the weight W.

In the embodiment, a case where radial basis function (RBF) shown in an equation (formula 10) is used as the kernel function for calculating the weight W will be described.

$$W = [w_1 \; w_2 \; \ldots \; w_m]^T = K_h(d) = \frac{1}{\sqrt{2\pi h^2}} e^{-d^2/h^2} \qquad \text{(Formula 10)}$$

Here, h is a kernel band width. The weight W quantifies a similarity between the electrical signal $X_{obs}$ in the apparatus signal data for evaluation and the electrical signal X in the apparatus signal data for learning.

Finally, the electrical signal data $X_{obs}$ in the apparatus signal data for evaluation calculates the prediction value corresponding to the apparatus state by combining the weight W using an equation (formula 11).

$$X_{est} = \frac{\sum_{i=1}^{m}(w_i x_i)}{\sum_{i=1}^{m}(w_i)} \qquad \text{(Formula 11)}$$

The soundness index value 2 and the threshold 2 corresponding to the electrical signal data $X_{obs}$ in respective apparatus signal data for evaluation depends on the weight W defined by the kernel function.

The soundness index value 2 in the embodiment is defined by squared prediction error (SPE). The SPE may be replaced by the definition of an error term which is generally used.

$$SPE = \Sigma_{i=1}^{n}(X_{obs} - X_{est})^2 \qquad \text{(Formula 12)}$$

The threshold 2 in the embodiment is defined as a region boundary of a rejection region 1% excluding a normal distribution confidence interval 99% in the SPE value, and it is defined such that the apparatus state at the time of acquisition of apparatus signal data for evaluation corresponding to the rejection region is determined to be abnormal.

Next, the soundness index value 1 and the soundness index value 2 calculated in S2004 are compared with the threshold 1 and the threshold 2 calculated in S1004, and it is determined whether the soundness index value 1 and the soundness index value 2 are larger than the threshold 1 and the threshold 2, respectively (S2005). As a result, in a case where the soundness index value 1 is smaller than the threshold 1 or the soundness index value 2 is smaller than the threshold 2 (NO in S2005), the step returns to S2001 to continue the recording of the apparatus signal data for evaluation.

On the other hand, in a case where the soundness index value 1 is larger than the threshold 1 and the soundness index value 2 is larger than the threshold 2 (YES in S2005), it is checked whether the state continues for a preset time (S2006). In a case where the YES state in S2005 does not continue for the preset time (NO in S2006), the step returns to S2001 to continue the recording of the apparatus signal data for evaluation.

On the other hand, in a case where the YES state in S2005 continues for the preset time (YES in S2006), a warning is displayed (output) on the display unit 242 (S2007).

Figure 4:
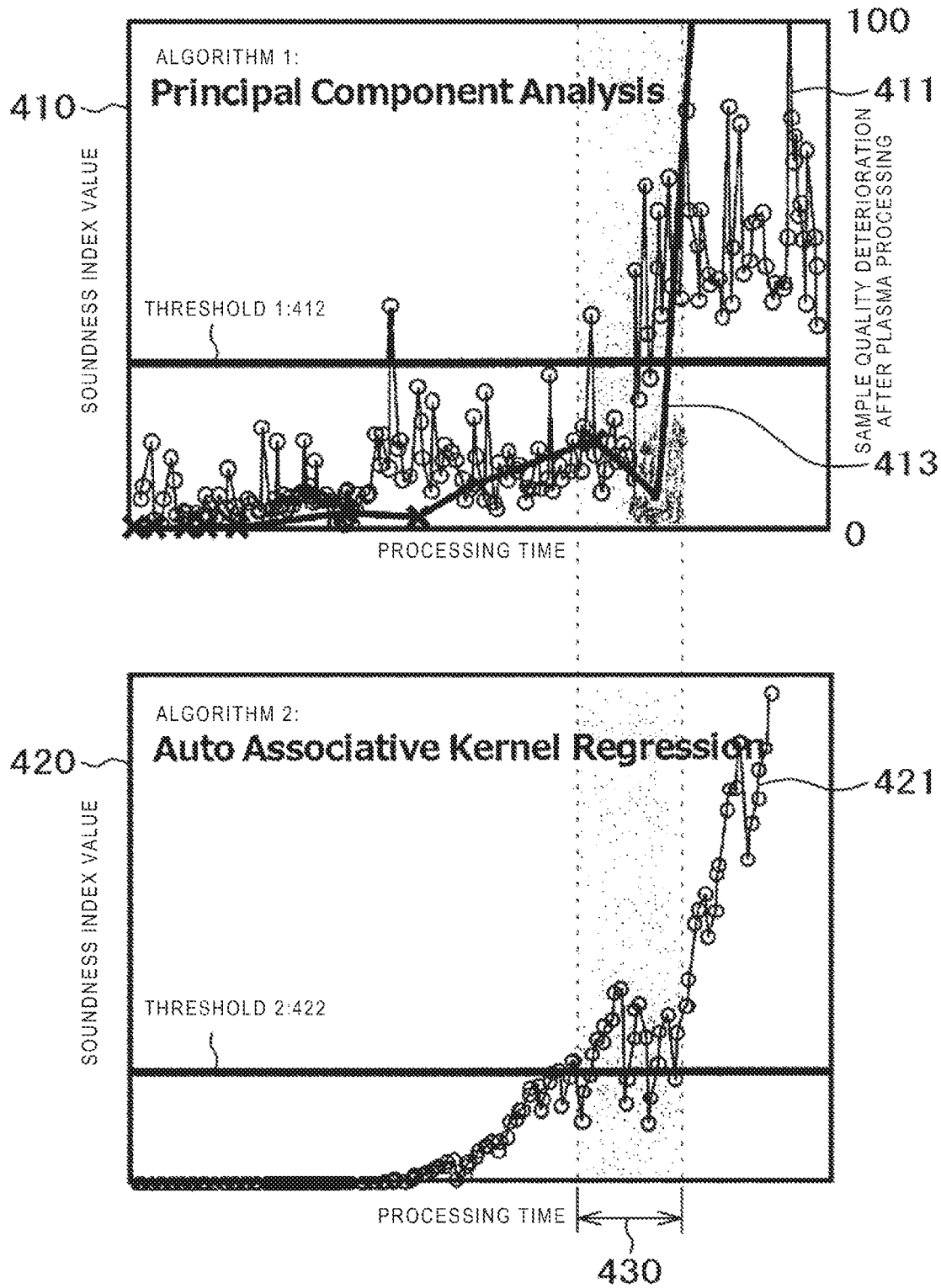
FIG. 4 is graphs showing PCA and AAKR applying result examples in the system configuration of the plasma processing apparatus according to the embodiment of the present invention.

In the processing control system configuration 200 of the plasma processing apparatus according to the embodiment, FIG. 4 shows an example of an apparatus state monitoring prediction result performed in a case of using AAKR for the calculation of the soundness index value 1 and the threshold 1, and using PCA for the calculation of the soundness index value 1 and the threshold 1.

Figure 3B:
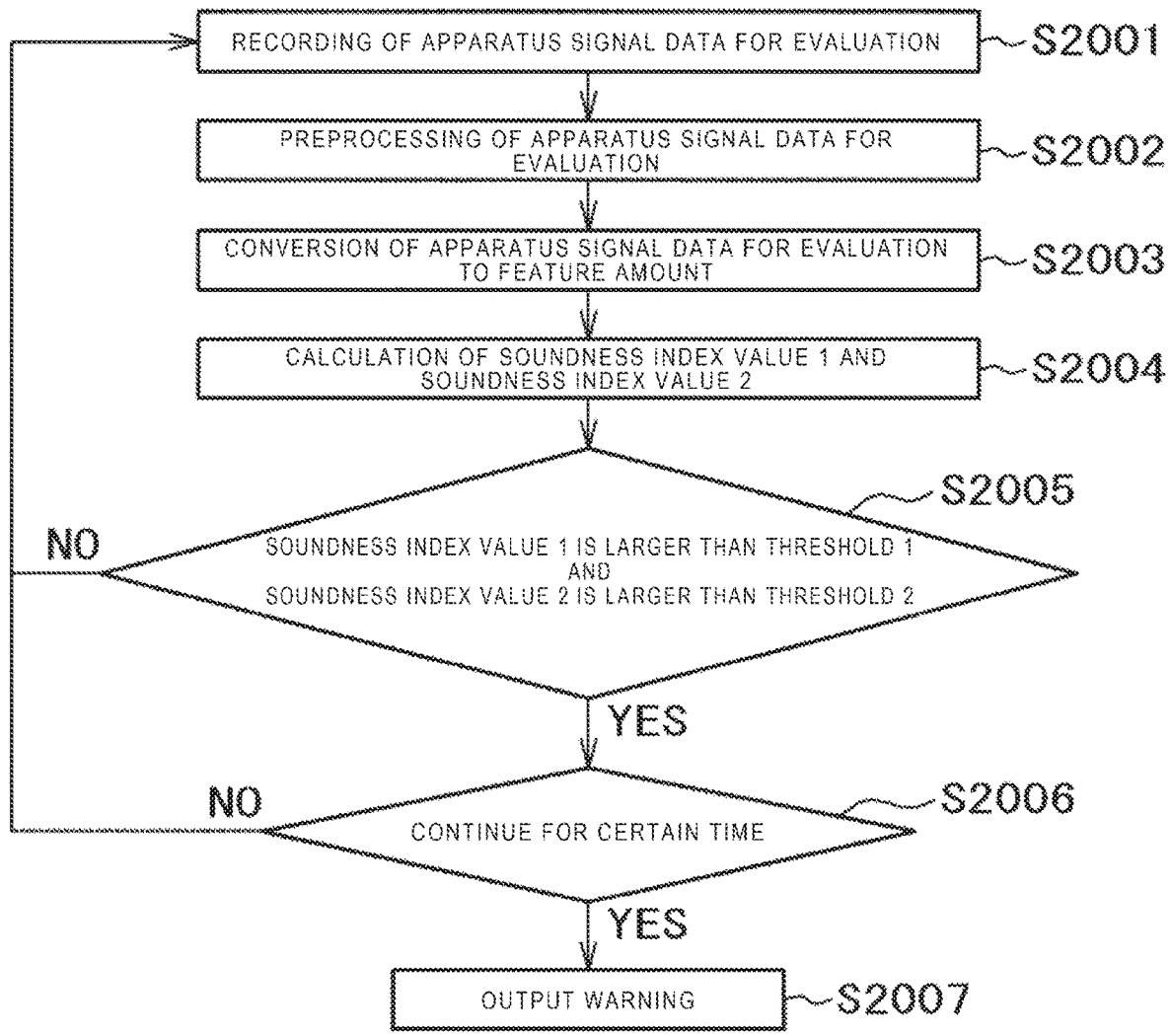
FIG. 3B is a flow diagram showing a procedure for monitoring soundness of the apparatus using apparatus signal data for evaluation in the system configuration of the plasma processing apparatus according to the embodiment of the present invention.

A graph 410 of FIG. 4 shows a relationship between a transition of a soundness index value 1:411 and a threshold 1:412 calculated through the processing steps from S1001 to S1004 described in FIG. 3A and the processing steps from S2001 to S2005 described using FIG. 3B, and a transition of a quality deterioration degree 413 determined from an actual sample quality inspection result after the plasma processing.

A graph 420 of FIG. 4 shows a relationship between a transition of a soundness index value 2:421 and a threshold 2:422 calculated through the processing steps from S1001 to S1004 described in FIG. 3A and the processing steps from S2001 to S2005 described using FIG. 3B.

In both graphs 410 and 420, the soundness index value 1:411 and the soundness index value 2:421 increase as a continuous operation time (processing time) of the plasma processing apparatus 100 increases. In graph 410 of FIG. 4, behaviors of the transitions of the soundness index value 1:411 and the quality deterioration degree 413 of an actual sample are similar to each other, and the soundness index value 1:411 well represents the sample quality.

Further, when comparing the graph 410 and the graph 420 of FIG. 4, times at which the soundness index value 1:411 and the soundness index value 2:421 respectively exceed the threshold 1:412 and the threshold 2:422 are the same.

A relationship between both the soundness index values 1 and 2 and the thresholds 1 and 2 shown in graph 410 and graph 420 of FIG. 4 well represents the change in the apparatus state of the plasma processing apparatus 100. That is, the relationship between the soundness index values 1 and 2 and the thresholds 1 and 2 is a good index value for determining the apparatus abnormality of the plasma processing apparatus 100.

Even though there is no deterioration of the sample quality after the plasma processing in graph 410 of FIG. 4, there is a point indicating the apparatus abnormality in which the soundness index value 1 exceeds the threshold 1. However, such point is an abnormality or false information not accompanying the apparatus maintenance, and it can be determined clearly by referring to the relationship between the soundness index value and the threshold of graph 420. That is, as shown in S2005 of FIG. 3B, it is possible to perform the abnormality determination detection with high accuracy by monitoring the relationship between both the soundness index values 1 and 2 and the thresholds 1 and 2.

During actual operation, for example, as shown in graph 410 and graph 420 of FIG. 4, in a case where the soundness index value 1:411 and the soundness index value 2:421 respectively exceed the threshold 1:412 and the threshold 2:422 continuously for a certain preset time t:430 (YES in S2006 of FIG. 3B), a warning is displayed on the display unit 242 and the maintenance accompanying the apparatus stop is performed. In a case where only any one of soundness index value exceeds the threshold (NO in S2005 of FIG. 3B), it is ignored and the processing from step S2001 is continued. Alternatively, there may be a rule in advance such as performing the plasma cleaning not accompanying the apparatus stop.

The soundness index value 421 of graph 420 of FIG. 4 exponentially increases, and it is possible to predict a time that exceeds the threshold approximately by applying a regression equation. The predicted result may be displayed on the display unit 242.

With PCA and AKKR described in the embodiment, it is possible to specify a data type which is changed significantly and to identify an abnormality factor (part) of the apparatus by calculating a contribution rate of the data type (variable) that causes a change in the calculated soundness index value and comparing the contribution rates of the data types. The identified abnormality factor (part) of the apparatus may be displayed on the display unit 242 together with a warning display.

In the processing control system configuration 200 of the plasma processing apparatus according to the embodiment, an algorithm to be used may be selected as follows.

First, in the plasma apparatus that continuously performs plasma processing of a sample or plasma processing for a dummy simulating the sample, or plasma processing performed without mounting the sample, a soundness index value 1 and a threshold 1 of the apparatus are calculated using an arbitrary algorithm stored in the directory unit using the emission data acquired during the processing.

Next, a time 1 in which the soundness index value 1 continuously exceeds the threshold 1 is calculated. Then, an algorithm in which a result of calculating a time 2 in which the soundness index value 2 of the apparatus continuously exceeds the threshold 2 for determining that the apparatus is abnormal is 0.5<time 1/time 2<1.5 is selected from the directory unit using the electrical signal data acquired during the processing.

In the processing control system configuration 200 of the plasma processing apparatus according to the embodiment, it may be configured to have means for comparing time-series waveforms of the data for each repetition with respect to the apparatus signal data recorded during the multi-stage step plasma processing which is performed repeatedly for each wafer processing and in which the control value is different in each wafer processing, and extracting only a part in which the signal waveform is changed for a long term.

In the processing control system configuration 200 of the plasma processing apparatus according to the embodiment, it may be configured such that the data recording unit 210 includes means (not shown) for removing a radio frequency component of the apparatus signal data, and the arithmetic unit 220 obtains the soundness index values 1 and 2 and the thresholds 1 and 2 using the apparatus signal data in which the radio frequency component is removed.

In the processing control system configuration 200 of the plasma processing apparatus according to the embodiment, it may be configured such that the arithmetic unit 220 includes a function of calculating a contribution rate of each data type with respect to the calculated soundness index value and specifying a data type contributing changes in the soundness index values 1 and 2, and recalculates the soundness index values 1 and 2 using only the data type having high contribution rate.

In the processing control system configuration 200 of the plasma processing apparatus according to the embodiment, it may be configured such that the arithmetic unit 220 includes a contribution rate calculating mechanism for calculating the contribution rate of each data type with respect to the calculated soundness index values 1 and 2, and clarifies a change factor of the soundness index values 1 and 2 by specifying the data type contributing the change in the soundness index values 1 and 2 based on the result calculated by the contribution rate calculating mechanism, and displaying the specified data type on the display unit 242.

In the processing control system configuration 200 of the plasma processing apparatus according to the embodiment, it may be configured such that the arithmetic unit 220 includes a mechanism for calculating a time at which soundness index values 1 and 2 respectively exceeds thresholds 1 and 2 by applying a linear or non-linear regression equation to the calculated soundness index values 1 and 2, and predicts an abnormality before an actual abnormality detection time in the determination unit.

As described above, according to the embodiment, in a plasma processing apparatus having a processing chamber that processes a sample, it is possible to optimally perform apparatus state monitoring, and plasma processing and apparatus maintenance after prediction with an apparatus state monitoring/prediction system for constantly recording apparatus signal data output from the apparatus, detecting an abnormality of the apparatus state with high accuracy, specifying an abnormality factor, and further predicting a time when the maintenance is required.

The invention made by the present inventor is described in detail based on the embodiments, but the present invention is not limited to the embodiments. It goes without saying that various modifications can be made without departing from the gist thereof. For example, the embodiments described above are described in detail for describing the present invention in an easily understandable manner, and are not necessarily limited to those including all the configurations described. It is possible to add/remove/replace another known configuration with respect to a part of the configurations of the embodiments described above.

What is claimed is:

1. A plasma processing apparatus in which a state is predicted by an analysis apparatus, comprising:
a processing chamber in which a sample is subjected to plasma processing,
wherein the analysis apparatus predicts the state based on a first soundness index value obtained by analyzing a first data obtained from the plasma processing apparatus using a first algorithm and a second soundness index value obtained by analyzing a second data obtained from the plasma processing apparatus using a second algorithm,
wherein the first algorithm is an algorithm in which a first time of the plasma processing is a time in which the state is determined as abnormal by the first time soundness index value, and
wherein the second algorithm is an algorithm in which a second time of the plasma processing is a time within a range of a third time to a fourth time,
wherein the second time of the plasma processing is a time in which the state is determined as abnormal by the second soundness index value,
wherein the third time is a time obtained by subtracting a predetermined time from the first time, and
wherein the fourth time is a time obtained by adding the predetermined time to the first time.

2. The plasma processing apparatus according to claim 1, wherein the first data is emission data obtained from plasma during the plasma processing, and
wherein the second data is data different from the first data.

3. The plasma processing apparatus according to claim 2, wherein principal component analysis (PCA) is used as the first algorithm, and
wherein auto associative kernel regression (AAKR) is used as the second algorithm.

4. The plasma processing apparatus according to claim 2, wherein the analysis apparatus removes a radio frequency component from the second data, and then analyzes the radio frequency component removed second data by using the second algorithm.

* * * * *